(12) United States Patent
Lin (10) Patent No.: US 7,582,914 B2
(45) Date of Patent: Sep. 1, 2009

(54) WHITE LIGHT EMITTING DIODE DEVICE

(76) Inventor: Yuan Lin, 3F, No. 16, Sec. 2, Zhong Yang South Road, Beitou District, Taipei City (TW)

( * ) Notice: Subject to any disclaimer, the term of this patent is extended or adjusted under 35 U.S.C. 154(b) by 260 days.

(21) Appl. No.: 11/657,030

(22) Filed: Jan. 24, 2007

(65) Prior Publication Data

US 2008/0111145 A1 May 15, 2008

(30) Foreign Application Priority Data

Nov. 9, 2006 (TW) .............................. 95219768 U (51) Int. Cl.
*H01L 33/00* (2006.01)

(52) U.S. Cl. .................... 257/98; 257/99; 257/E33.061; 257/E33.058

(58) Field of Classification Search .................... 257/98, 257/E33.061
See application file for complete search history.

(56) References Cited

U.S. PATENT DOCUMENTS

| 2004/0120155 A1* | 6/2004 | Suenaga ..................... 362/362 |
| 2004/0129946 A1* | 7/2004 | Nagai et al. .................... 257/98 |
| 2007/0004065 A1* | 1/2007 | Schardt et al. ................ 438/26 |

* cited by examiner

*Primary Examiner*—Tu-Tu V Ho
(74) *Attorney, Agent, or Firm*—Birch, Stewart, Kolasch & Birch, LLP (57) ABSTRACT

The present invention relates to a white light emitting diode device, which comprises a light emitting diode device; a base case, which is provided with a fillister for placing the LED and a rabbet; and a covering element, which is installed over the fillister and fixed on the rabbet and consists of two transparent sheets; wherein a light-pervious binding agent containing phosphors is sandwiched between the two transparent sheets, thereby phosphors contained in the binding agent is excited by the light source emitted from the light emitting diode and generates white light emitted from the device.

10 Claims, 8 Drawing Sheets

WHITE LIGHT EMITTING DIODE DEVICE

FIELD OF THE INVENTION

The present invention relates to a white light emitting diode device, especially a white light emitting diode device which emits white light resulting from exciting a phosphor with a color light emitting from color emitting diode devices.

BACKGROUND OF THE NEW UTILITY MODEL

At present light emitting diode units, several light emitting diodes with red light, yellow light, blue light, etc, have been developed. The light emitting diodes emit light sources with different colors by means of chosen different phosphors. For example, phosphor materials such as GaAs semiconductors and so on are mainly used to emit red light. Phosphor materials such as AlInGaP semiconductors and so on are mainly used to emit yellow light. Nitride semiconductors such as $In_xGa_yAl_{1-x-y}N$ wherein $0 \leq x \leq 1$ and $0 \leq y \leq 1$ are mainly used to emit blue light. If a light emitting diode emitting white light can be produced, light sources with different colors can be generated as desired by simply using light filters. Therefore, industrial society makes many efforts in developing white light emitting diodes.

The current developed white light emitting diodes mainly use a light emitting diode emitting color light in conjunction with a phosphor, and white light can be generated by using the color light source to excite the phosphor substance. Compared with red and yellow light emitting diodes, a blue light emitting diode can present a luminescence with high luminance and are more widely used. For example, International Publication No. WO98/5078 discloses that white light can be generated by using a blue-emitting LES as the light source and, on the LED chip, placing a phosphor substance such as YAG:Ge phosphor substance that can absorb part of the blue light and emit yellow light. Nichia Kagaku Kogyo Kabushiki in Taiwanese Publication No. TW383508 corresponding to U.S. Pat No. 5,998,925 provides a light emitting device comprising a light emitting component and a luminescent phosphor, wherein the emitting layer of the emitting component is composed of nitride compound semiconductors and the luminescent phosphor is a garnet phosphor which contains at least one element selected from a group of Y, La, Gd and Sm and at least element selected from a group of Al, Ga and In and is cerium-activated. Therefore, white ligh emitting diode can be produced by choosing a light emitting diode with different light colors in conjugation with phosphors which can emit lights with various colors upon exciting with the light.

The above white light emitting diode devices are produced by covering element the light emitting diode chip directly with a binding agent containing specific phosphor, so that when the light emitted from the light emitting diode passes through the binding agent, the phosphor contained in the binding agent would be excited and the LED finally emits white light. However, if the LED chip is directly covered with the binding agent containing phosphor, since the covering element is not even and in different thicknesses, there is problem that the phosphor would not be evenly distributed in each part of the binding agent and it is thus possible to generate a chromatic aberration when the light passes through.

Furthermore, as each LED grain manufactured in each batch emits different wavelengths, to obtain the white light as desired, the kind of phosphor and its concentration in the binding agent should be appropriately selected depending on wavelength of the light emitting diode grain to be used, which results complex process.

Moreover, covering element the LED chip directly with the binding agent containing phosphors is defective in process due to numerous and complicated procedures in the operation.

In order to improve the above drawback of the white light diode device, the present invention achieves an even distribution of the phosphor in the binding agent by placing and clamping a light-pervious binding agent containing phosphors between two transparent sheets and thus simplifies the process.

SUMMARY OF THE INVENTION

The present invention relates to a white light emitting diode device, which comprises a light emitting diode (LED); a base case, which is provided with a fillister for placing the LED and a rabbet; and a covering element, which is installed over the fillister and fixed on the rabbet and includes two transparent sheets and a phosphors containing light-pervious binding agent sandwiched between the two transparent sheets, thereby phosphors contained in the binding agent is excited by the light source emitted from the light emitting diode and generates white light emitted from the device.

DETAILED DESCRIPTION OF THE INVENTION

In the white light emitting diode device of the present invention, the light emitting diode (LED) is packaged and fixed in the fillister of the base case by any means, preferably by further using of light-pervious binding agents.

In the white light emitting diode device of the present invention, the base case can be in any shape, such as round, elliptic, triangular, quadrilateral, polygonal shapes, and so on. The shape of the covering element is correspondingly a round, elliptic, triangular, quadrilateral, polygonal shapes, and so on.

In the white light emitting diode device of the present invention, one of the two transparent sheets consisting the covering element is provided with a shallow fillister for placing the binding agent and at least one trench around the fillister for overflowing the excess binding agent.

In the white light emitting diode device of the present invention, the two transparent sheets consisting the covering element is in a plane sheet or a curved sheet, i.e., convex lens.

In the white light emitting diode device of the present invention, the light emitting diode can be any light emitting diodes that emits color light, such as red light-emitting diodes, yellow light-emitting diodes, and blue light-emitting diodes. Among them, the blue light-emitting diode is preferable due to its high luminance and high output power and without being affected by temperature to generate a color shift. Moreover, the light emitting diode in the white light emitting diode device of the present invention can be settled with one or more depending on the final use as required.

Furthermore, in the white light emitting diode device of the present invention, the kind of the phosphor varies with the kind of the light emitting diode and has no limitation. In principle, any kinds of phosphors can be used as long as it can be excited by the color light from the light emitting diode to generate white light. For instance, when a blue light-emitting diode is used, red phosphors such as $Y_2O_2S:Eu^{3+}$, $Bi^{3+}$, $YVO_4:Eu^{3+}$, $Bi^{3+}$, $SrS:Eu^{2+}$, $SrY_2S_4:Eu^{2+}$, $CaLa_2S_4:Ce^{3+}$ and $(Ca,Sr)S:Eu^{2+}$ and green phosphors such as $YBO_3:Ce^{3+}$, $Tb^{3+}$, $BaMgAl_{10}O_{17}:Eu^{2+}$, $Mn^{2+}$ and $SrGa_2S_4:Eu^{2+}$; or yellow phosphors such as $Ca-\alpha-SiAlON:Eu^{2+}$, etc. can be used. The selection of color light emitting diode and the corresponded phosphors to generate white light is well known and found in, for example, Taiwan Patent Publication No. TW383508 corresponding to U.S. Pat. No 5,998,925, TW533604, U.S. Pat. No. 6,252,254B1, U.S. Pat. No. 6,686,691B1, U.S. Pat. No. 6,669,866B1, U.S. Pat. No. 6,649,946B2, U.S. Pat. No. 6,657,379B2, U.S. Pat. No. 6,943,380B2, and WO 00/33389; and non-patent references such as J. Solid State Chem. 165, 19 (2002); J. Am. Ceram. Soc. 85, 1229 (2002); J. Am. Ceram. Soc. 87, 1368 (2004); J. Phys. Chem. B180, 12027 (2004); and Appl. Phys. Lett. 84, 5404 (2004) can be referred. Therefore, the details will not be redundantly described in the text.

The light-pervious binding agent can be any thermosetting binding agent as long as it is transparent and can be passed by the light through. For example, epoxy resin, UV curing resin, silicone resin and so on can be used. The light-pervious binding agent is used to retain and fix the phosphors in the covering element. The kind of the binding agent is well known to persons skilled in the art, and thus the details will not be redundantly described in the text.

According to the white light emitting diode device of the present invention, the covering element containing the phosphors and the base case for placing the LED are respectively manufactured to obtain a semi-finished product of the covering element containing the phosphor substance and a semi-finished product of the base case for placing the LED. Subsequently, the covering element having various characteristics and specifications can be chosen according to the selected LED and the requirement of users or customers, for example to select the covering element with different thickness and various concentration of the phosphors, so that the light emitting diode devices emitting various white light, such as daylight, warm white light, low warm white light, cold white light and so on, can be created. For industrial application, stock sizes of finished products can be reduced and the manufacturing cost can be further lowered.

According to the white light emitting diode device of the present invention, since the covering element containing the phosphors and the base case for placing the LED are separately manufactured to obtain a semi-finished product of the covering element and a semi-finished product of the base case, the covering element containing the phosphors can be suitably selected depending on the light wavelength of the selected LED to carry on the base to easily determine what thicknesses of the covering element, what kind and concentration of phosphors is suitable for the light wavelength of the selected LED. Therefore, the procedures for selecting LED and covering element matched therewith are much simpler and more convenient than prior methods for covering element LED grains directly with binding agents containing phosphors. Therefore, the production cost can further be lowered and the waste of binding agents resulting from the mismatching of LED grains with the binding agents can be diminished.

PREFERRED EMBODIMENTS OF THE INVENTION

The present invention will be further illustrated by the following embodiments by reference to the accompanied drawings. Nevertheless, the exemplified embodiments are only intended to describe the present invention more detail without restricting the scope of the present invention. For instance, in the preferably exemplified embodiments, the light emitting diode is only used in one LED grain. However, more than one, such two, three, and four, etc., of the light emitting diode can be used in the present invention depending on the final uses.

Figure 1:
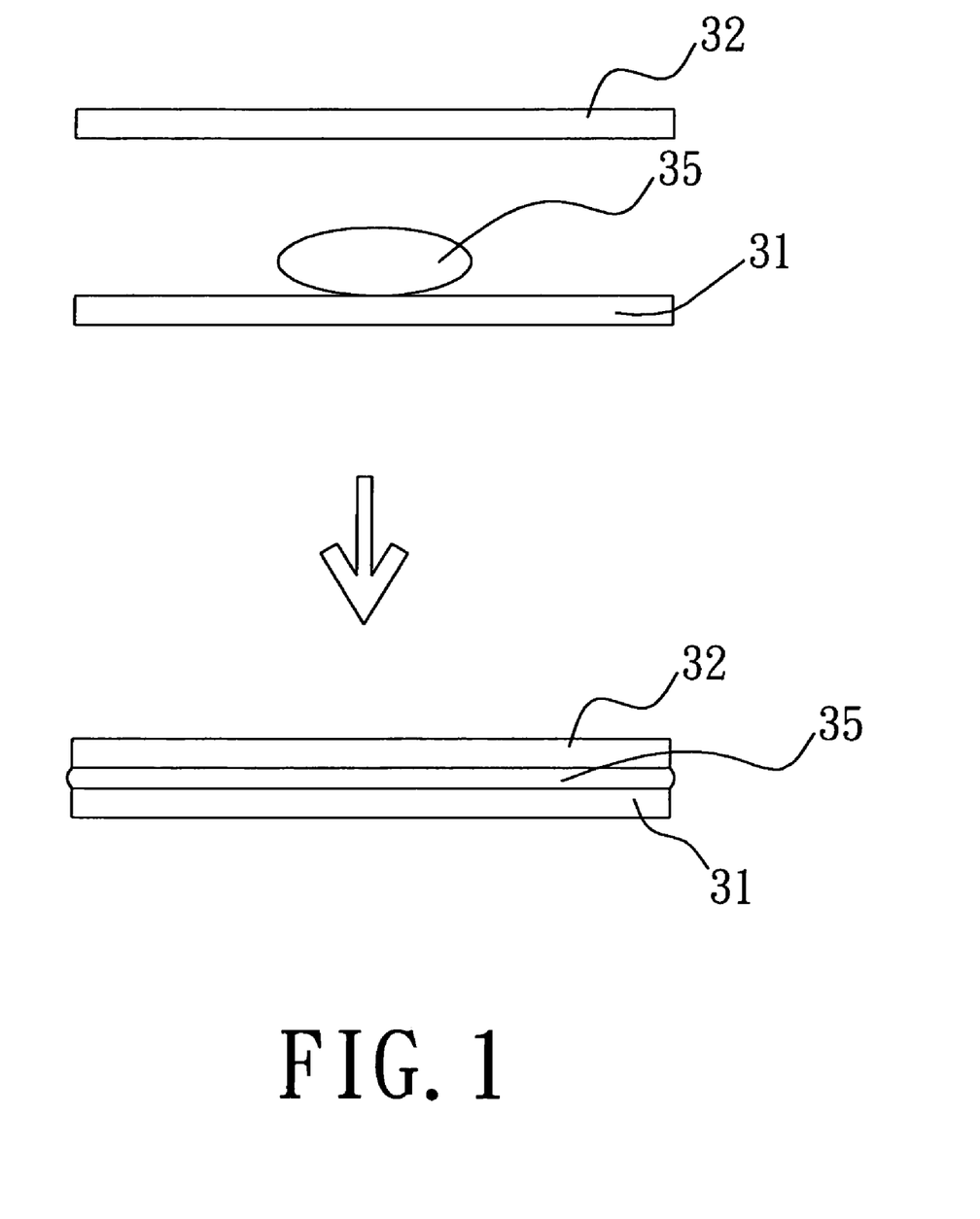
FIG. 1 is a schematic drawing showing the process for making a covering element in the first embodiment of the white light emitting diode device of the present invention.
Figure 2:
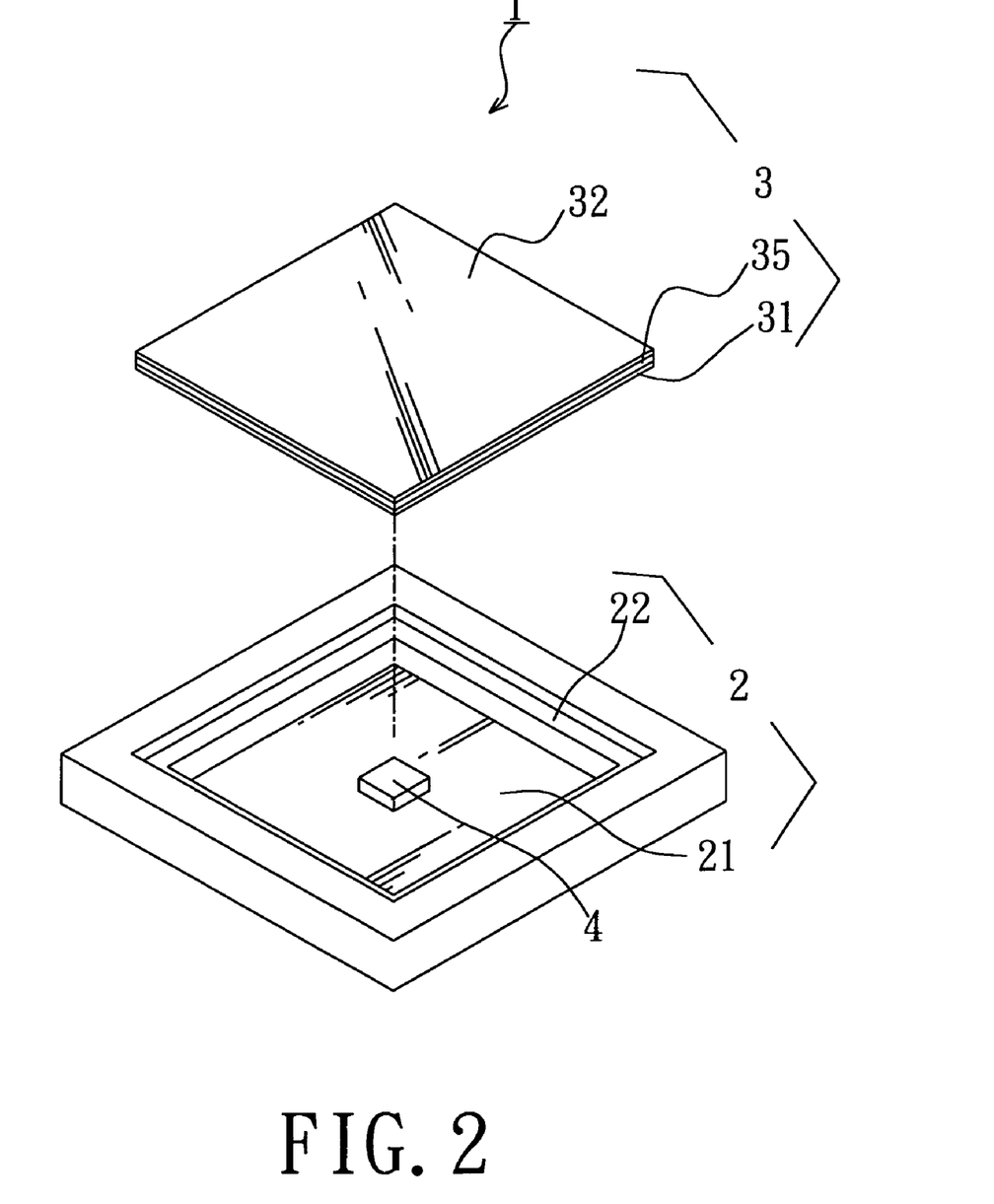
FIG. 2 is a stereogram of the first embodiment of the white light emitting diode device of the present invention.
Figure 3:
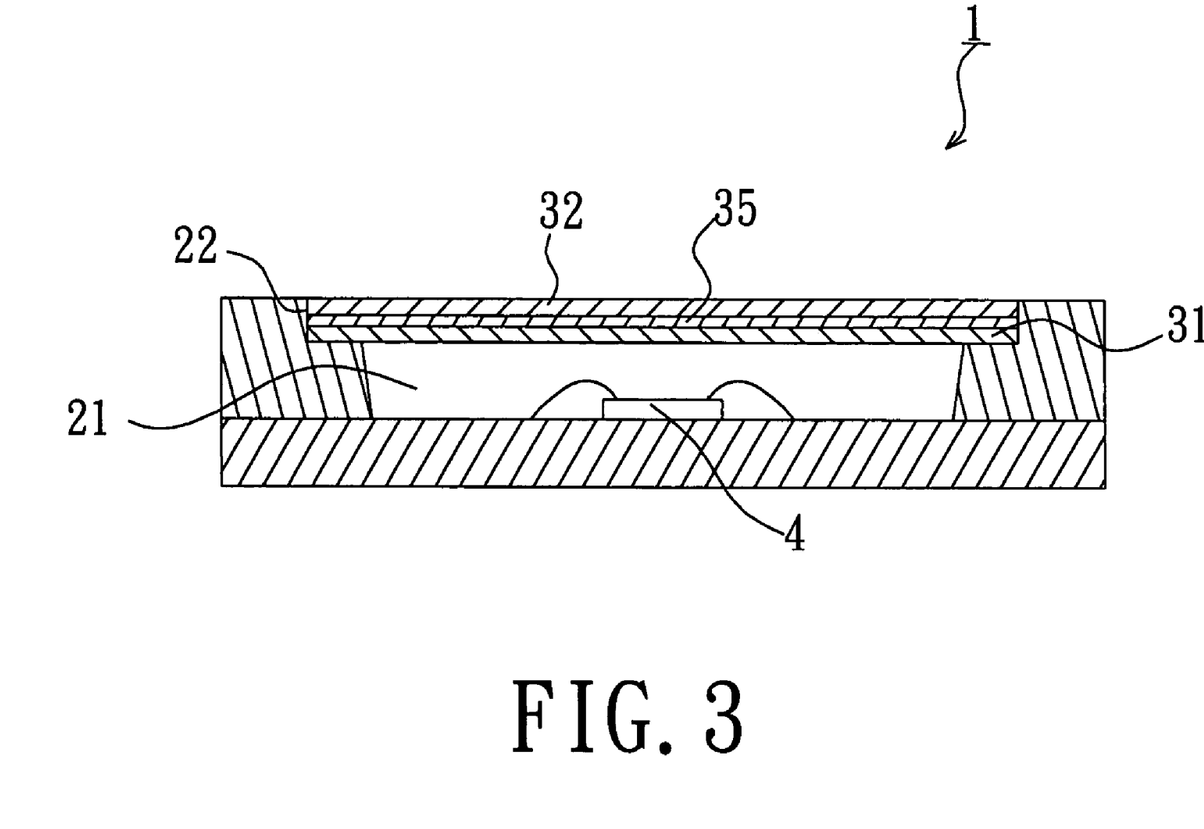
FIG. 3 is a cross sectional view of the white light emitting diode device shown in FIG. 2.
Figure 4:
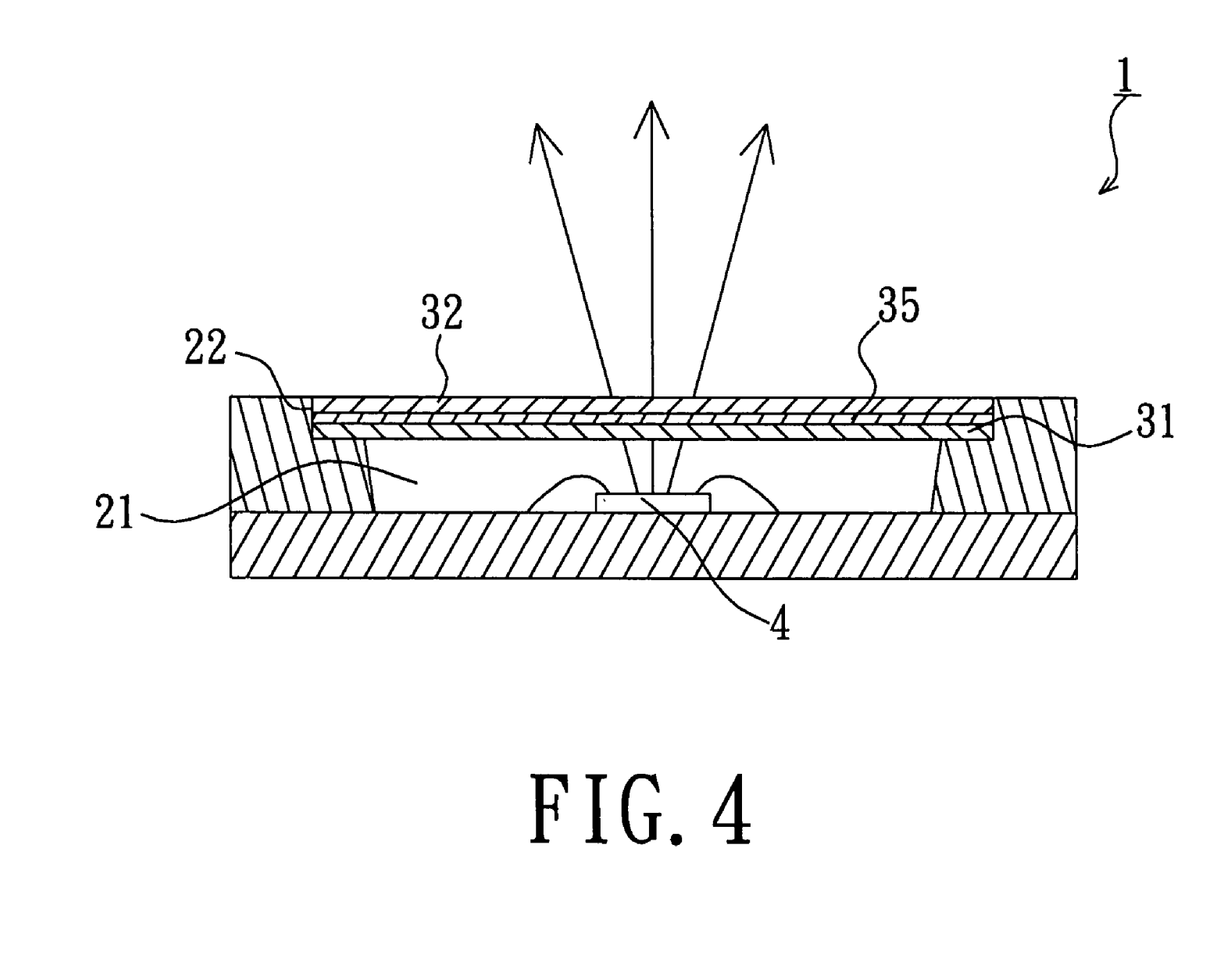
FIG. 4 is a cross sectional view showing the state that the white light emitting diode device shown in FIG. 3 is in activation.

First at all, please refer to FIGS. 1 to 4. FIG. 1 is a schematic drawing showing the process for making a covering element in the first embodiment of the white light emitting diode device of the present invention. FIG. 2 is a stereogram of the first embodiment of the white light emitting diode device of the present invention. FIG. 3 is a cross sectional view of the white light emitting diode device shown in FIG. 2. FIG. 4 is a cross sectional view showing the state that the white light emitting diode device shown in FIG. 3 is in activation. As shown in FIG. 2 and FIG. 3, the white light emitting diode device 1 of the present invention comprises a base case 2, a covering element 3, and a light emitting diode 4. The base case 2 is provided with a fillister 21 for placing the light emitting diode 4 and a rabbet 22 on the edge over the base case for supporting the covering element 3. The covering element 3 consists of two transparent sheets 31 and 32, and a light-pervious binding agent layer 35 containing phosphors is sandwiched between the two transparent sheets 31 and 32.

Furthermore, as shown in FIG. 1, in the white light emitting diode 1 of the first embodiment of the present invention, the light-pervious binding agent layer 35 containing the phosphors is made by uniformly blending the light-pervious binding agent and the phosphors, dropping the binding agent containing the phosphors on one of the transparent sheet 31, then pressing the other transparent sheet 32 onto the transparent sheet 31 under a constant pressure. After uniformly distributed between the two transparent sheets 31 and 32, the binding agent is hardened by heating or irradiation to obtain the covering element 3.

Subsequently, the covering element 3 is installed on the rabbet 22 provided on the edge over the base case 2 in which the LED 4, such as a blue light-emitting LED, has been installed in the fillister 21 of the base case 2. As shown in FIG. 4, the light source emitted from the LED 4 passes through the covering element 3 and simultaneously excites the phosphors contained in the light-pervious binding agent layer 35 and the light emitted from the LED device in a white light. Thus the white light emitting diode device of the present invention is obtained. Examples of the binding agents include, but not be limited to, for example, an epoxy resin, a UV curable resin, a silicone resin and so on, and the examples of the phosphors include, but not be limited to, for example, YAG, i.e., yttrium aluminum garnet.

Figure 5:
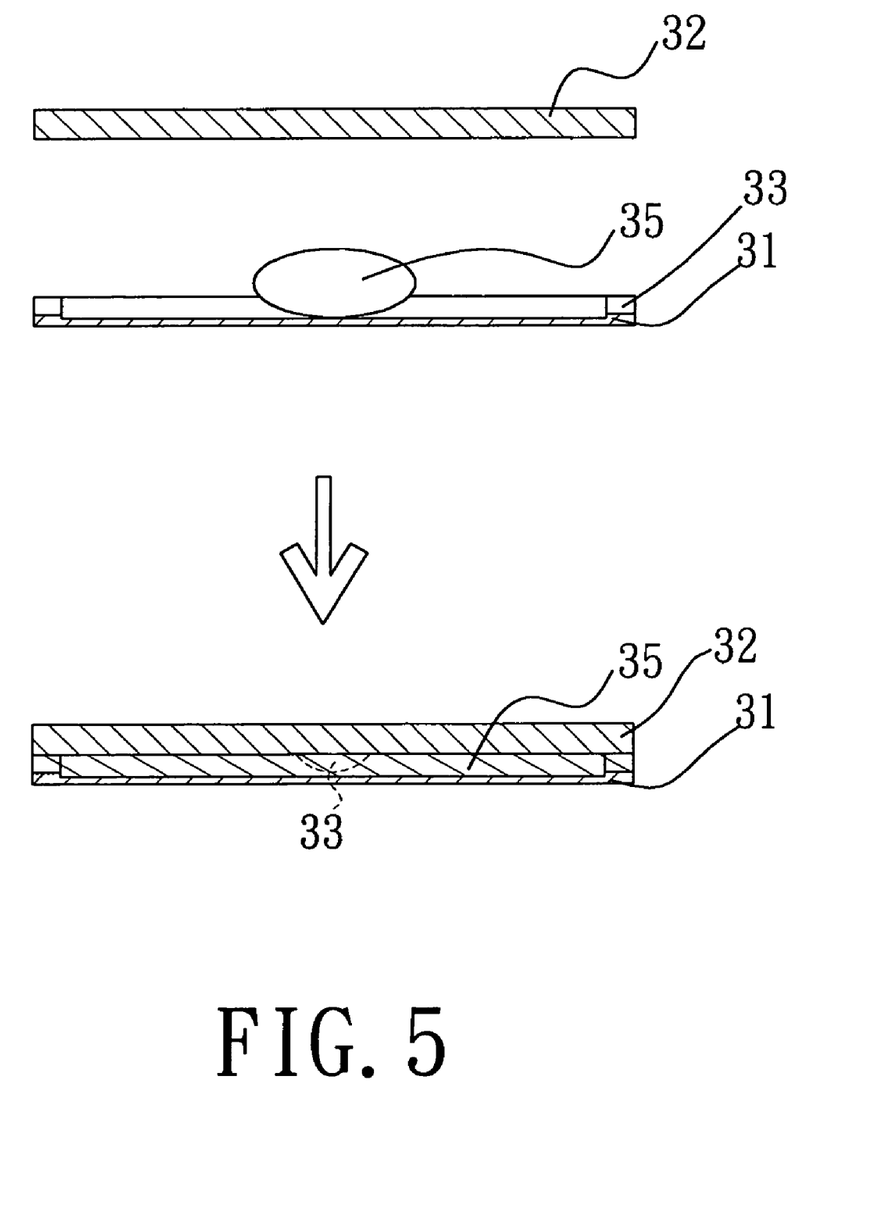
FIG. 5 is a schematic drawing showing the process for making a covering element in the second embodiment of the white light emitting diode device of the present invention.
Figure 6:
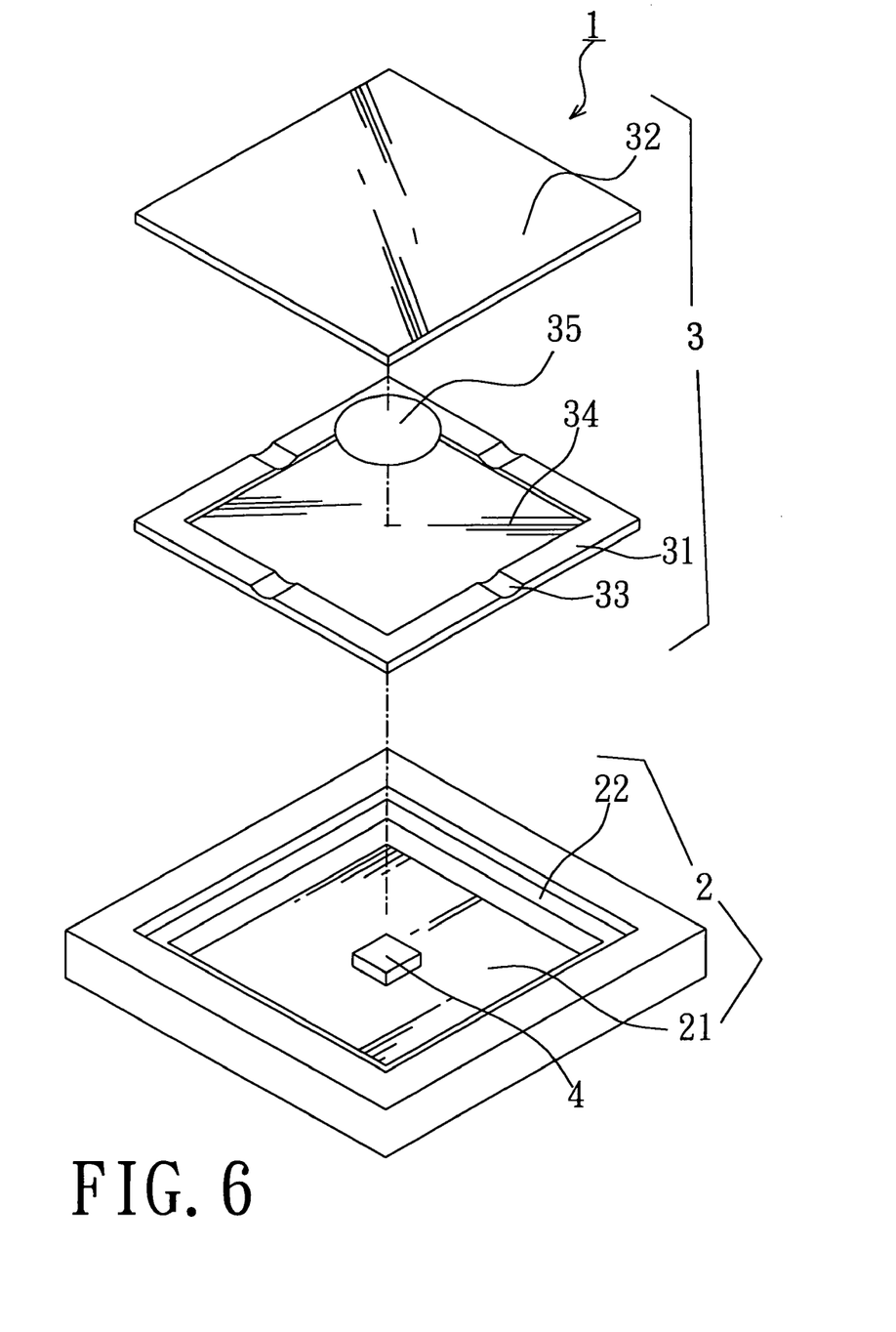
FIG. 6 is a stereogram of the second embodiment of the white light emitting diode device of the present invention.
Figure 7:
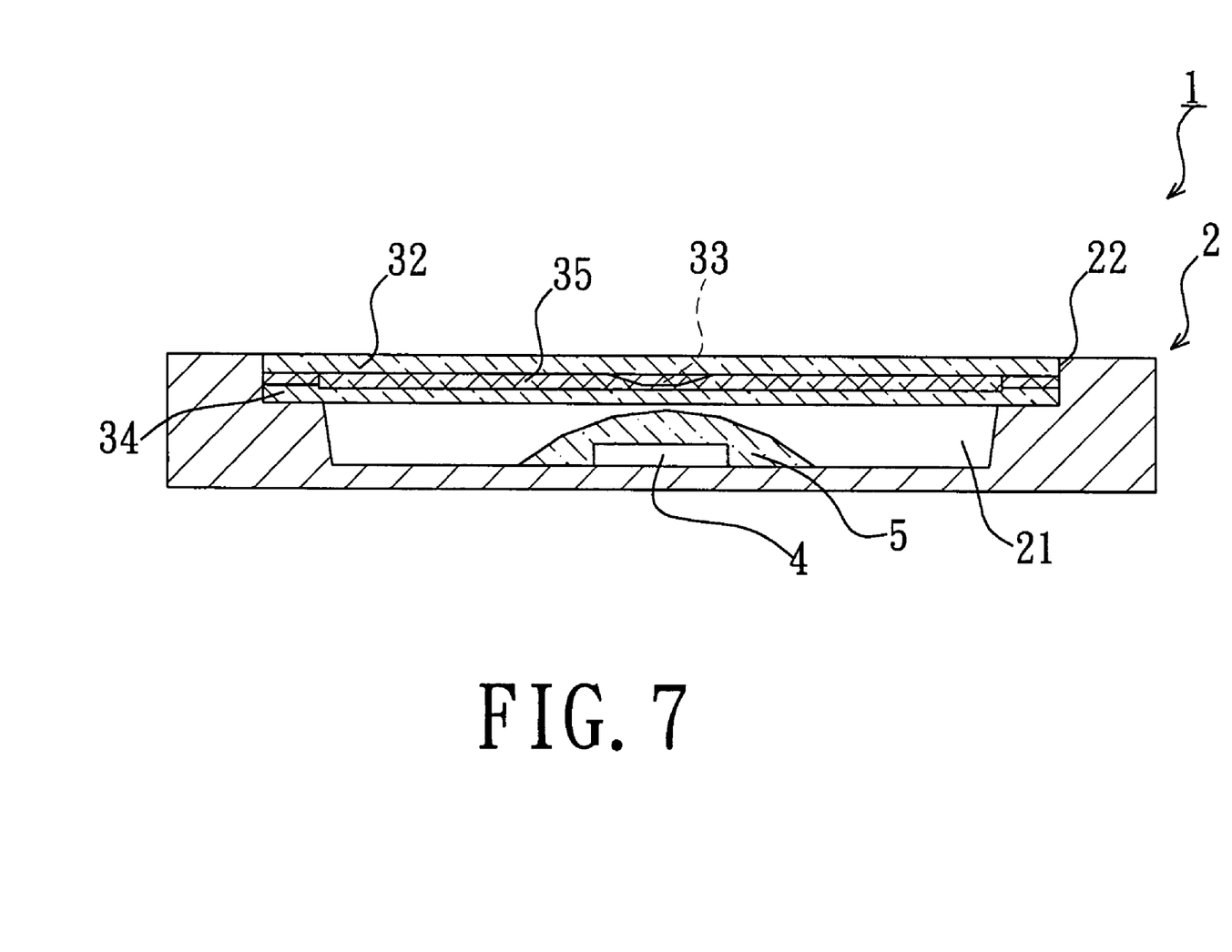
FIG. 7 is a cross sectional view of the white light emitting diode device as shown in FIG. 6.

FIGS. 5 to 7 show the second embodiment of the present invention. FIG. 5 is schematic drawing showing the process for making a covering element in the second embodiment of the white light emitting diode device of the present invention. FIG. 6 is a stereogram of the second embodiment of the white light emitting diode device of the present invention. FIG. 7 is a cross sectional view of the white light emitting diode device as shown in FIG. 6. As shown in FIG. 6 and FIG. 7, in the second embodiment of the white light emitting diode device of the present invention, the configuration of the base case is the same as that shown in FIG. 1. In the second embodiment, the covering element 3 consists of two transparent sheets 31 and 32, and a light-pervious binding agent layer 35 containing phosphors is sandwiched between the two transparent sheets 31 and 32. However, one of the two transparent sheets 31 is further provided with a shallow fillister 34 for placing the light-pervious binding agent and is provided with at least one overflow trench 33 around the shallow fillister so that when the binding agent is dropped into the shallow fillister 34 of the sheet 31 and the other sheet 32 is pressed to cover the sheet 31, the surplus binding agent could overflow along the trench 33. Subsequently, the binding agent is hardened by heating or irradiation to obtain a light-pervious binding agent layer 35 containing phosphors inside, as shown in FIG. 5. By the installation of the overflow trench 33, the binding agent placing between the two sheets 31 and 32 can be much uniformly distributed over the whole covering element 3 without generating bubble therein so that lightness of the emitting light after excitation becomes more even.

Additional, in the second embodiment of the present invention, the LED 4 is further covered and fixed by a transparent binding agent 5 to install in the fillister 21 of the base case 2, with provided that the light-pervious binding agent 5 would not affect the light intensity emitted from the LED 4.

Figure 8:
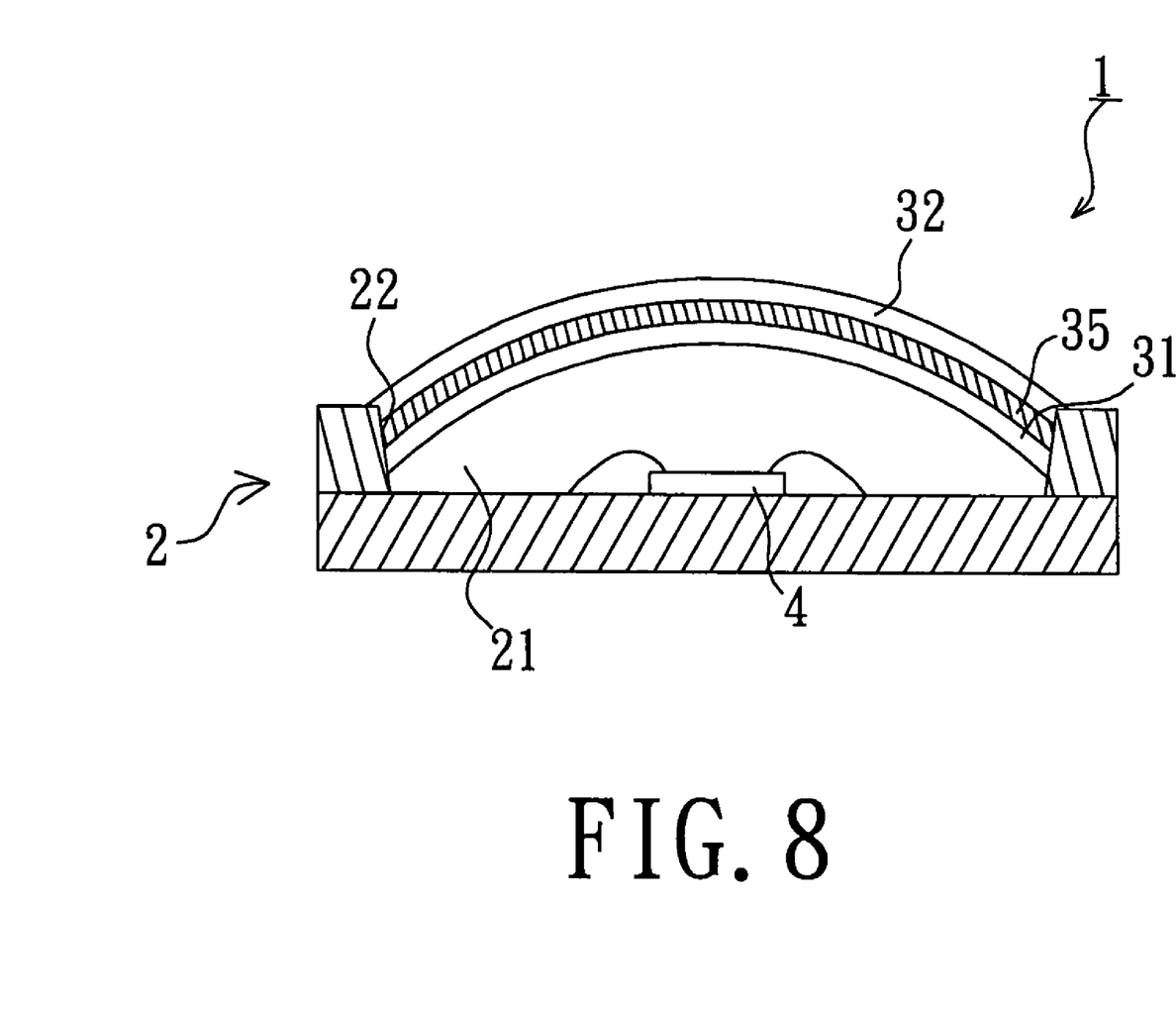
FIG. 8 is a cross sectional view of the third embodiment of the white light emitting diode device of the present invention.

FIG. 8 shows the third embodiment of the present invention. FIG. 8 is a cross sectional view of the third embodiment of the white light emitting diode device of the present invention. In the third embodiment of the white light emitting diode device of the present invention, the configuration of the base case is the same as that shown in FIG. 1. However, in the third embodiment, the covering element 3 consists of two transparent sheets 31 and 32 in the form of curved surfaces. Accordingly, the light-pervious binding agent layer 35 sandwiched between the two curved transparent sheets 31 and 32 is also correspondingly in the form of a curve shape.

In addition, the exemplified base case in the above embodiments of the present invention is in the shape of quadrilateral, but it can change into any shape, such as, a round, an ellipse, a triangle, or a polygon shapes depending on the final design of the product. The LED can be any light emitting diode that emits color light. The phosphors contained in the binding agent layer can be any one or more of yellow phosphors, green phosphors, and red phosphors as long as the phosphors can emit white light after being excited by the light source emitted from the selected LED and thus has no particular limitation.

Although the present invention is further illustrated by the above embodiments, they are only the preferable embodiments of the present invention and are not used to restrict the scope of the present invention. Persons skilled in the art can make various modifications and improvements within the sprit and the scope of the present invention, and these modifications and improvements still belong to the scope of the present invention.

What is claimed is:

1. A white light emitting diode device, which comprises a light emitting diode device (LED); a base case, which is provided with a fillister for placing the LED and a rabbet; and a covering element, which is installed over the fillister and fixed on the rabbet and comprises two transparent sheets and a phosphors containing light-pervious binding agent sandwiched between the two transparent sheets, thereby phosphors contained in the binding agent is excited by the light source emitted from the light emitting diode and generates white light emitted from the devices,
   wherein one of said transparent sheets consisting said covering element is further provided with a shallow fillister for placing said binding agent and provided with at least one trench around said shallow fillister.

2. The white light emitting diode device according to claim 1, wherein said light emitting diode (LED) is packaged and fixed inside said fillister of said base case by using a light-pervious binding agent.

3. The white light emitting diode device according to claim 1, wherein number of said LED are one or more.

4. The white light emitting diode device according to claim 1, wherein said transparent sheets constituting said covering element is a plane sheet.

5. The white light emitting diode device according to claim 1, wherein said transparent sheets constituting said covering element is a curve sheet.

6. The white light emitting diode device according to claim 1, wherein said light emitting diode is at least one selected from group consisting of blue light-emitting diodes, red light-emitting diodes, and yellow light-emitting diodes.

7. The white light emitting diode device according to claim 1, wherein said light emitting diode is a blue light-emitting diode.

8. The white light emitting diode device according to claim 1, wherein said phosphors are a red phosphor and a green phosphor.

9. The white light emitting diode device according to claim 1, wherein said phosphor substance is a yellow phosphor.

10. The white light emitting diode device according to claim 1, wherein said light-pervious binding agent is at least one selected from group consisting of an epoxy resin, a UV curable resin, and a silicone resin.

* * * * *